United States Patent [19]

Michalek et al.

[11] Patent Number: 5,479,095

[45] Date of Patent: Dec. 26, 1995

[54] METHOD AND APPARATUS FOR MEASUREMENT OF AC AND DC ELECTRICAL CURRENT

[75] Inventors: Jan K. Michalek; Ebrahim B. Shahrodi, both of Newark, Ohio

[73] Assignee: Power Corporation of America, Newark, Ohio

[21] Appl. No.: 269,145

[22] Filed: Jun. 30, 1994

[51] Int. Cl.[6] ................................................. G01R 33/00
[52] U.S. Cl. ........................ 324/117 H; 324/117 R; 324/115; 324/127; 324/142
[58] Field of Search ........................ 324/117 H, 117 R, 324/127, 115, 142, 96; 307/128; 340/661, 664, 870.28

[56] References Cited

U.S. PATENT DOCUMENTS

| | | | |
|---|---|---|---|
| 4,682,101 | 7/1987 | Cattaneo | 324/117 R |
| 5,119,073 | 6/1992 | Nelson et al. | 340/661 |
| 5,146,156 | 9/1992 | Marcel | 324/117 H |
| 5,181,026 | 1/1993 | Granville | 324/96 |

*Primary Examiner*—Kenneth A. Wieder
*Assistant Examiner*—Kourosh Cyrus Khosravi

[57] ABSTRACT

The present invention involves measurement of an electrical current by means of a current transformer having the current to be measured passing in an axial direction through the current transformer, and the voltage induced thereby in the windings of the current transformer are used to produce a first voltage. A Hall effect is used in series with the current transformer to produce a second voltage measurement corresponding to the current measured by the Hall effect sensor. When the two measurements agree to within a predetermined value (typically 5% of the root-mean-square current values measured by each sensor) then the current transformer reading is used as the more accurate. Otherwise, the Hall effect current sensor is used as the more accurate current measurement.

5 Claims, 1 Drawing Sheet

METHOD AND APPARATUS FOR MEASUREMENT OF AC AND DC ELECTRICAL CURRENT

FIELD OF INVENTION

This invention relates generally to the field of measurement of electrical current. More particularly, this invention relates to a method and apparatus for combining various current measurement techniques to give improved accuracy of current measurements for ac as well as for dc currents and also for currents having in combination a significant dc portion along with ac current.

BACKGROUND OF INVENTION

The electrical utility companies have shown considerable interest in obtaining detailed information concerning the nature and amount of electrical usage by their customers. As utilities attempt to reduce costs, and deliver electrical power to customers in the most efficient manner possible, detailed and reliable data concerning the needs and usage of power by the customers becomes very important. Additionally, unusual variations in the amount or nature of power usage could indicate a developing problem in the delivery of power, allowing the utility to intervene with appropriate maintenance procedures prior to the onset of power shortages. Major power consuming customers also are interested in having more detailed and reliable information concerning their own electrical usage in an attempt to increase their efficiency of power usage and to hold down costs.

The basic electrical quantities typically measured directly are the current and voltage. From these fundamental measurements other quantities, such as power, are calculated. Therefore, the accuracy and reliability of the fundamental measurements of voltage and current set inherent limits on the accuracy of power determinations and other electrical quantities calculated from current and voltage. The subject of the present invention is to present a method and apparatus for increasing the accuracy of current measurements under various conditions of ac, dc and combined ac and dc current flows.

A common device for the measurement of ac currents is the "current transformer". The current transformer ("ct") consists essentially of a substantially toroidal shaped core of magnetic material around which are wrapped a number of turns of insulated electrical conductor, the "windings". The conductor carrying the current to be measured passes axially through the ct, resulting in the current to be measured being surrounded by the toroidal structure of the ct. The voltage induced in the windings is measured to ascertain the current passing axially through the ct.

It is a fairly sophisticated problem to design the ct to produce very accurate current measurements for the anticipated ac current magnitudes and frequency ranges. For example, the core material, the core geometry, and number and size of the windings are all considerations in producing accurate current measurements. However, by careful attention to all aspects of the ct design, it is possible to achieve accuracies of current measurements in the range of better than 0.01% for a particular frequency range (typically 50 to 60 Hz as typically necessary for measurement of current in power distribution systems).

However, the accuracy of typical current transformers is often seriously degraded when significant dc components are present in the current passing through the ct. The presence of dc current produces a substantially constant magnetic field superimposed on the time-varying magnetic field generated by the passage of ac current axially through the ct core. This dc component of magnetic field tends to cause saturation in the magnetic core of the ct, leading to very serious errors introduced into the current readings produced by the ct. Typically, when the dc current comprises approximately 5% or more of the total root-mean-square ("rms") current to be measured, serious errors in ct current measurements may be anticipated. The error of ct ,current measurements as a function of dc current component is generally a complex function of the design of the ct as well as the nature of the ac current present. However, for most cases of practical interest, the error of ct current measurements is a steeply rising function as increasing proportions of dc current is present.

Another common method for current measurements is based upon the "Hall effect". Basic electromagnetic theory teaches that moving charges will experience a force when placed in a magnetic field. In particular, charges carrying current will experience forces perpendicular to the current flow when placed into a magnetic field whenever the applied magnetic field has a component perpendicular to the current flow. These forces experienced by the charges carrying the current are perpendicular both to the current flow and to the (perpendicular component) of the applied magnetic field. The well-known "right-hand rule" of electromagnetic theory gives the direction of the force on the charges in terms of the direction of the magnetic field and the direction of motion of the charges (i.e. the direction of current flow). Forces tending to displace the current-carrying charges in a direction perpendicular to the current flow will generate a voltage perpendicular to the current. The Hall effect typically utilizes a current flowing through a thin conductor with a magnetic field applied perpendicular to the flat face of the conductor. A voltage will be produced perpendicular to both the current flow and applied magnetic field. The size of this Hall effect voltage is a direct measure of the applied magnetic field.

Hall effect current sensors are commercially available devices. Essentially, they typically employ a substantially toroidal core of magnetic material having a relatively thin gap radially through the torus; essentially similar to a toroidal-shaped magnetic with facing pole pieces. A thin piece of material carrying current is placed in this gap and voltage measurement devices measure the Hall effect voltage generated across this material. The conductor carrying the current to be measured passes axially through the toroidal core of the Hall effect sensor. The magnetic field generated by the current to be measured changes the magnetic field (and hence the voltage) generated by the Hall effect across the current-carrying conductor.

Such Hall effect sensors can measure dc as well as ac currents. However, they suffer from the disadvantage that the current measurements are not as accurate as desired; typically 5–7% error in current values. Thus, the present invention is a combination of ct and Hall effect sensors combined in such a manner as to use the ct sensor for the range of ac currents in which it is known to be highly accurate while using the Hall effect sensor when the ct sensor is known to give unreliable results. The method and apparatus for switching from Hall effect to ct sensors so as to achieve maximum practical current measurement accuracy under ac, dc as well as combined ac-dc currents, is the subject of the present invention.

SUMMARY OF THE INVENTION

The present invention relates to an apparatus and method for measuring electrical currents having ac, dc or mixed ac-dc currents. A current transformer and Hall effect current sensor are used in series to produce two independent measurements of the current. When the two current measurements agree to within a predetermined limit (typically 5% in root-mean-square current values) the current measured by the current transformer is selected as the more accurate and reliable current value. When the current as measured by the current transformer and the Hall effect current sensor differ by more than the predetermined limit, the Hall effect current value is selected as the more accurate measurement.

OBJECTS OF THE INVENTION

A primary objective of the present invention is to determine values of electrical current when both ac and dc currents are present.

Another object of the present invention is to use a current transformer to measure ac currents when small components of dc current are present.

Yet another object of the present invention is to use a Hall effect current sensor to measure dc current when combined with ac current.

Another object of the present invention is to use a Hall effect sensor to measure current when only dc currents are present.

Another object of the present invention is to provide, internal to the measurement apparatus, decision making criterion to select between the Hall effect measured current value and the current transformer measured current value.

DESCRIPTION OF PREFERRED EMBODIMENTS

Figure 1:
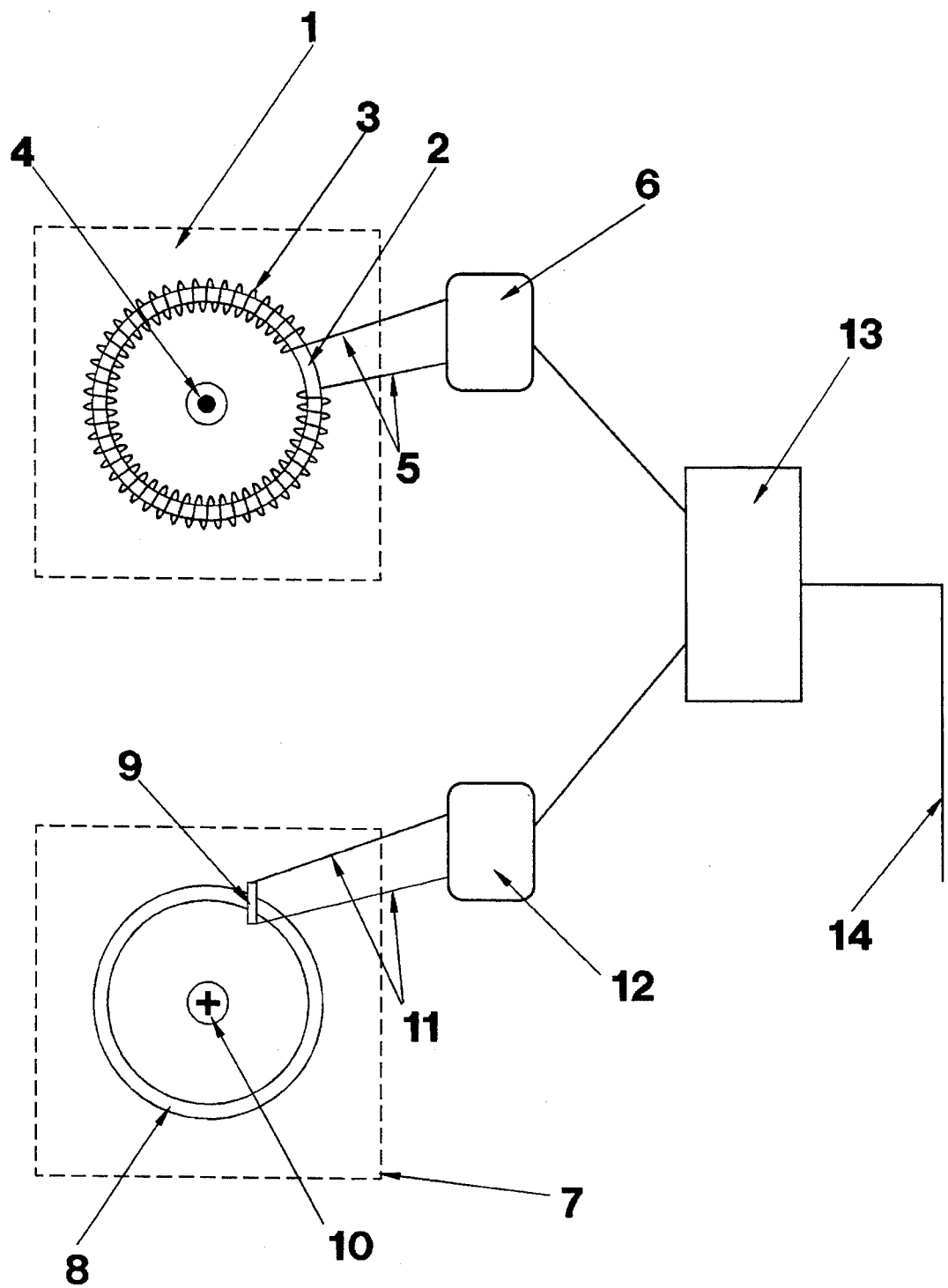
FIG. 1. Schematic diagram of the apparatus of present invention showing current to be measured passing sequentially through current transformer and Hall effect current sensor the order being immaterial).

We show in schematic form in FIG. 1 an apparatus typical of the present invention. Two separate current sensors are employed. 1, in FIG. 1 is a schematic representation of a current transformer ("ct") comprising a core, 2, and windings of an insulated conductor, 3, around the core, 2. The core, 2, would typically be manufactured from a magnetic material. The particular material used in the fabrication of the core, as well as the core shape and geometry, will typically be determined in order to optimize performance of the ct for the particular current values and frequencies to be measured; customarily in the range 50 to 60 Hz for power distribution systems. However, the detailed design of the ct is not an important feature of the present invention. The present invention can be satisfactorily employed with a variety of ct designs and constructions so long as the ct is known to be accurate for a specific range of ac values.

The ct core, 2, is typically wound with numerous turns of an insulated conductor, 3. Such windings, 3, are an additional design feature which the designer of the ct can adjust as to size, insulation, number of windings, etc. for optimum ct performance.

The current to be measured is delivered through the torus of the ct by means of a conductor shown as 4 in FIG. 1. Following standard electrical conventions, 4, denotes current flowing through ct, 1, in a direction out of the plane of the page. The direction of current flow is not important in the performance of the ct nor in the practice of the present invention. As discussed above, the ct is essentially a measurement device for alternating current in which current flows in both directions through conductor, 4. Direct current flow through the ct constitute a serious source of error in the operation of typical current transformers. However, an important feature of the present invention is the measurement of dc and mixed ac-dc currents as well as pure ac current. For clarity of description we indicate a direction of current flow, it being understood that it strictly applies only to dc, while reversed current flows have no effect on the operation of the present invention.

In addition, it is not essential that the current flow through the ct in the center of the torus. It is only necessary for the present invention that the torus of the ct completely surround the conductor carrying the current to be measured, 4.

The passage of current through conductor, 4, induces a voltage across the ends of the windings of the ct, 5. Such induced voltage is measured by means of a voltage measurement device, 6. Numerous techniques exist for the measurement of voltages which may be employed in connection with the present invention. The particular voltage measurement procedure is not an essential feature of the present invention, so long as the voltage measurement technique employed introduces no unacceptable measurement errors.

We also show in FIG. 1 in schematic form a Hall effect current sensor, 7. The typical commercially available Hall effect current sensor consists of a magnetic material substantially in the shape of a torus, 8 having a small gap therein. Into this gap is typically inserted a flat conductor or semiconductor, 9, upon which the Hall effect is produced. A current is caused to flow through the Hall effect conductor or semiconductor, 9 by circuitry external to FIG. 1 and not shown therein. Application of a magnetic field perpendicular to the current flow in 9 by means of magnetic torus, 8, will cause a voltage to be induced perpendicular to both the magnetic field and the Hall effect current flow. This Hall effect induced voltage is sensed across the Hall effect conductor or semiconductor, 9, by means of leads, 11, and volt meter 12.

The Hall effect is produced in conductor or semiconductor, 9 by the magnetic field imposed perpendicular to the current flowing through 9. This magnetic field is the sum of the fields produced by the magnetic material of the core, 8, and the magnetic field produced by the current to be measured inducing additional magnetic effects in core, 8, thereby altering the magnetic field across Hall effect sensor, 9. We show by 10 in FIG. 1 the current to be determined flowing through the torus formed by the core, 8, of the Hall effect sensor. The standard electrical notation is used in 10 to denote current flowing into the plane of the page. As noted above, the direction of the current flow through the Hall effect sensor, 7, is not critical in the practice of the present invention. Nor is it critical that the current, 10, flow through the center of the core, 8. However, it is necessary that the current to be measured flow sequentially through ct, 1, and Hall effect sensor, 7 such that both sensors receive the entire flow of current to be measured. We indicate this in schematic form in FIG. 1 by showing current, 4, in ct sensor, 1, exiting from the plane of the page towards the viewer, while current 10 in the Hall effect sensor, 7, returns back through the plane of the page in a direction away from the viewer. Reversed current flows are equivalent and the order of current flow through Hall effect sensor, 7, and ct, 1 is immaterial.

Thus, in accordance with the present invention, two simultaneous current measurements are taken. The first by means of the ct as detected by volt meter, 6. The second by means of the Hall effect sensor as detected by volt meter 12. A further aspect of the present invention is to determine an accurate current value from two such independent measurements.

As noted above, when the dc component of current flow is small, the ct is capable of highly accurate current measurements. When dc current flow becomes significant, however, the reliability of the ct seriously degrades. The Hall effect sensor, however, is reasonably accurate (typically 3%–10%) independent of the relative proportion of dc current flowing, through the conductor.

Thus, another aspect of the present invention is to continuously compare the current values determined by the ct through volt meter 6, with the current values determined by the Hall effect sensor through volt meter, 12. If the current values as determined by the ct, 1, and the Hall effect sensor, 7 are in agreement to within a certain predetermined accuracy (say 5% rms current value), then the current determined by the ct is used as the best value. On the other hand, when the values of current determined by the ct, 1, and Hall effect sensor, 7 differ by more than this predetermined amount, the method of the present invention concludes that the ct is in error due to the presence of dc current. In this case, the current measurement made by the Hall effect sensor is taken to be the most reliable.

The comparison of ct current values with Hall effect values could typically be performed by means of a microprocessor, 13, or similar comparison circuit. The current value judged to be the most reliable by the method of the present invention, as discussed above, is then routed to 14 for use in computing power, or for other purposes.

We claim:

1. An apparatus for measuring electrical current comprising:

a) a current transformer having the current to be measured passing axially therethrough and producing a first voltage corresponding to a first measured value of said current; and, b) a Hall effect current sensor having said current to be measured passing axially therethrough, in series with the passage of said current through said current transformer, and producing a second voltage corresponding to a second measured value of said current; and, c) a comparison device receiving substantially simultaneously said first and said second voltages and selecting a selected voltage from said first and said second voltages, said device comparing said first and second measured current values wish each other and with a predetermined error limit, and said device selecting said first voltage if said measured currents agree to within said predetermined error limit, and selecting said second voltage otherwise; and, d) a switch directing said selected voltage to an output terminal.

2. An apparatus as in claim 1 wherein said comparison device is a microprocessor.

3. An apparatus as in claim 1 wherein said predetermined error limit is 5% of root-mean-square current values.

4. A method for measuring electrical current comprising the steps of:

a) measuring said current by passing said current axially through a current transformer producing thereby a first voltage corresponding to said first measured current; and, b) measuring said current by passing said current axially through a Hall effect current sensor producing thereby a second voltage corresponding to said second measured current value; and, c) comparing said first and said second measured current values with each other and with a predetermined error limit; and, d) selecting said first voltage if said first and second measured current values agree to within said predetermined error limit, and selecting said second voltage otherwise.

5. A method as in claim 4 wherein said predetermined error limit is 5% of the measured root-mean-square current values.

* * * * *